United States Patent [19]
Hankey et al.

[11] 3,772,773
[45] Nov. 20, 1973

[54] ELECTRICAL COMPONENT AND METHOD OF MAKING THE SAME

[75] Inventors: Robert E. Hankey, Andalusia; Martin J. Arrizabalaga, Norristown; Edwin Olejkowski, Philadelphia, all of Pa.; Cyrill Pouch, Cherry Hill, N.J.; Charles H. Snyder, Philadelphia, Pa.

[73] Assignee: Technitrol, Inc., Philadelphia, Pa.

[22] Filed: June 4, 1971

[21] Appl. No.: 149,923

[52] U.S. Cl. .......... 29/602, 29/627, 333/19
[51] Int. Cl. .......... H01f 7/06
[58] Field of Search .......... 333/19; 29/624–630 B, 600, 601, 602

[56] References Cited

UNITED STATES PATENTS

| | | | |
|---|---|---|---|
| 2,886,880 | 5/1959 | Eisler | 29/602 |
| 3,002,260 | 10/1961 | Shortt et al. | 29/602 |
| 3,084,420 | 4/1963 | Burr et al. | 29/602 |

*Primary Examiner*—Charles W. Lanham
*Assistant Examiner*—Robert M. Rogers
*Attorney*—Yuter & Fields

[57] ABSTRACT

The method of making a delay line utilizing a material having an upper and a lower electrically conducting surface separated by a dielectric layer comprising placing a plurality of delay line patterns on the upper and lower electrically conducting surfaces wherein each delay line pattern comprises at least two sections. The upper and lower electrically conducting surfaces are connected together through the dielectric layer at at least two points in each one of the delay line patterns. Portions of the upper and lower surfaces are removed to leave only electrically conducting surfaces in the shape of the plurality of delay line patterns on the dielectric layer. The material is then folded to align the sections of each pattern. Each pattern is then separated from the preceding and succeeding pattern to provide a plurality of individual delay line patterns. Connecting terminals are provided for each one of the delay line patterns to provide a plurality of delay lines.

The disclosure further includes the apparatus produced by said method.

18 Claims, 9 Drawing Figures

INVENTORS:
ROBERT E. HANKEY
MARTIN J. ARRIZABALAGA
EDWIN OLEJKOWSKI
CYRILLE POUCH
CHARLES H. SNYDER
BY: Yuter + Fields
Attorneys

ELECTRICAL COMPONENT AND METHOD OF MAKING THE SAME

This invention relates generally to the field of delay lines and, more particularly, pertains to a method of fabricating a delay line and the apparatus so produced.

Signal delay lines have many applications in the field of signal processing. For example, delay lines are used extensively in radar communication networks and in computers. Generally, the delay lines are used to establish the time of arrival of signals at particular points in the signal processing circuits.

While numerous types of delay lines exist in the prior art, the simplest construction consists of a long wire. Since the signal takes a finite time to transverse the wire, the signal at the output of the wire delay line is delayed in relationship to the signal at the input. However, as can be imagined, because of the high speed of transmission of the signal, the dimensions of these delay lines become enormous in order to obtain any appreciable delay.

An improvement over the above described simply delay line is the coaxial delay line, as is well known in the art. The capacitive and inductive coupling between the inner and outer conductors of the line contributes to the length of time it takes a signal to traverse the line. That is, the coupling decreases the speed of the signal. However, in most coaxial delay lines, it is still necessary to have many feet of line to obtain a fraction of a millisecond delay.

While other types of delay lines are presently commercially available, they also have disadvantages associated with their use and manufacture. For example, while so-called lumped constant delay lines provide a relatively short delay line in comparison to the delay obtained, such delay lines are extremely bulky and, accordingly, are unsuited for use in present-day circuitry where the trend is toward miniaturization. However, one type of delay line which is presently gaining widespread acceptance for use in miniature circuits is the so-called strip delay line. These strip delay lines utilize a meandering conductor which is surrounded by a dielectric material. These delay lines are formed by either molding the dielectric material around the conductor or bonding the same to the conductor. However, these strip delay lines suffer from a number of serious disadvantages. For example, they are fabricated on a per unit basis and therefore they are expensive to manufacture. Additionally, in a meandering delay line the current flows in opposite directions thereby decreasing the amount of inductance per unit length.

Accordingly, an object of this invention is to provide an improved method for constructing a delay line.

A more specific objective of this invention is to provide a method for simultaneously fabricating a plurality of delay lines.

Another object of the invention is to provide a method for the fabrication of a distributed constant delay line.

A further object of the invention is to provide a relatively economical and easily automated method for fabricating a delay line which may advantageously be utilized in conjunction with miniaturized circuits.

Accordingly, a method of making a delay line in accordance with the present invention utilizes a material having an upper and a lower electrically conducting surface separated by a dielectric layer and comprises connecting together the upper and lower surfaces through the dielectric layer. A desired delay line pattern is placed on the upper and lower surfaces and portions of the upper and lower electrically conducting surfaces are removed except for those portions thereof bearing the delay line pattern so that only the upper and lower electrically conducting surfaces in the shape of the delay line pattern are left on the dielectric layer. The outer portions of the material are folded inwardly so that each outer portion of the material is superposed over a portion of the delay line pattern formed on the upper surface. The material is then folded back to align the portions of the delay line pattern on each side of the first fold line with each other. Connecting terminals are provided for the delay line patterns to provide the delay line.

A further object of the present invention is to provide a delay line which occupies a minimum volume and wherein the inductance per unit length of the line is increased over that of a meandering type delay line.

Other features and advantages of the present invention will become more apparent from a consideration of the following detailed description when taken in conjunction with the accompanying drawing, in which.

Figure 1:
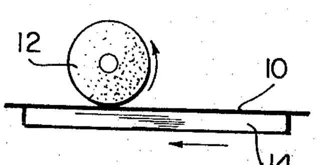
FIG. 1 is a side elevational view in diagrammatic form illustrating the grinding of the dielectric layer to a desired thickness.

Accordingly, a delay line utilizing the method of the present invention is fabricated by cutting a dielectric material to the desired size and grinding the material to the desired width so that the dielectric layer is substantially of uniform width. Thus, as shown in FIG. 1, the dielectric layer 10 is ground to the desired width by an abrasive or grinding wheel 12. The dielectric layer 10 is maintained in place by a magnet 14. After one face of the dielectric layer has been ground to the desired smoothness, the layer 10 is reversed so that the other face is exposed to the grinding wheel. The faces of the layer may be alternately ground until the desired width is obtained. Alternatively, two grinding wheels which are spaced by the desired width may be located above and below the dielectric layer and the dielectric layer fed therebetween to obtain a dielectric layer of the desired uniform width.

Figure 2:
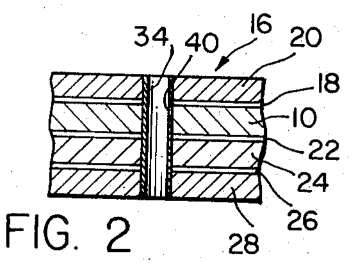
FIG. 2 is a side elevational view to an enlarged scale of a portion of the delay line pattern sheet illustrating the connection between upper and lower surfaces.

Appropriate electrically conducting surfaces are laminated to the dielectric layer 10 to provide a sheet designated generally by the reference numeral 16 in the enlarged view of FIG. 2, upon which delay line patterns may be placed. More specifically, a bonding material 18 such as a heat sensitive adhesive material, is placed on the upper surface of the dielectric layer 10. A sheet of copper or similar electrically conducting material 20 is then placed on the bonding layer 18. Additionally, a bonding material or layer 22 is placed on the bottom surface of the dielectric layer 10 and an insulating sheet 24 which may be made of Mylar or the like is placed on the layer 22. Another bonding material or layer 26 is then placed on the bottom surface of the insulating sheet 24 and another copper sheet or sheet of electrically conducting material 28 is placed on the layer 26. The lamination is completed by applying pressure and heat to the sheet 16 so that the upper and lower electrically conducting surfaces, the dielectric 10 and the insulating layer 24 are bonded together in a unitary structure.

Figure 3:
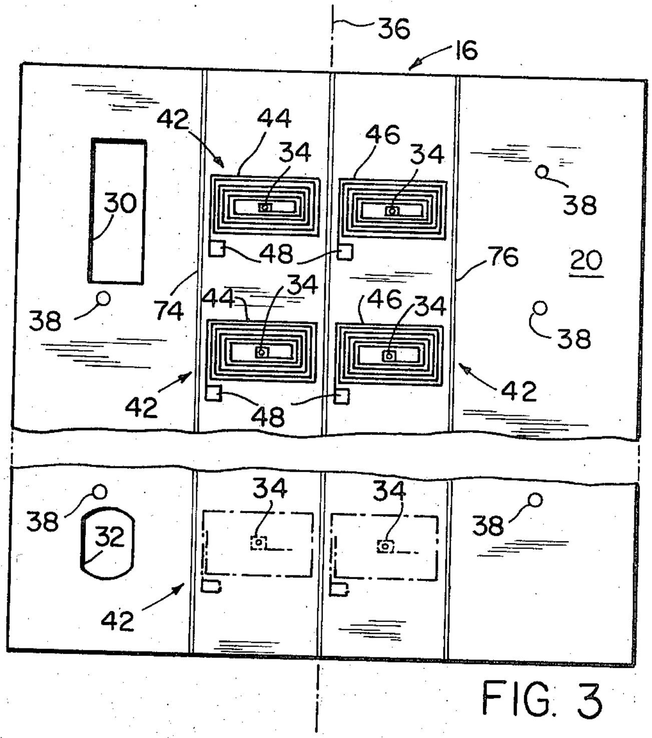
FIG. 3 is a top plan view of the delay line pattern sheet, with parts broken away.

Since the sheet 16 is now ready to undergo various mechanical operations in the method of the present invention, appropriate registration holes may be punched in the sheet 16 so that the sheet will remain in a predetermined alignment for the succeeding steps. Accordingly, as shown in FIG. 3, an upper rectangular registration hole 30 and a lower registration hole 32 having rounded upper and lower edges are punched in the sheet 16 so that the sheet 16 may be mounted on an appropriate jig or the like, wherein studs project through the holes 30 and 32 to align the sheet 16.

Thereafter, spaced pairs of holes 34 are placed in the sheet 16 by either drilling or punching the same or the like. One pair of holes 34 are provided for each delay line pattern which will be placed on the delay line pattern sheet 16. As shown in FIG. 3, the holes 34 are spaced an equal distance from the center line 36 of the sheet 16. The holes 34 extend from the top surface of the electrically conducting sheet 20 to the bottom surface of the lower electrically conducting sheet 28 through the dielectric layer 10, as shown in FIG. 2.

One feature of the present invention is that a plurality of delay lines may be fabricated from the single sheet 16. Accordingly, unit registration holes may be provided for each one of the delay line patterns placed on the sheet 16. Thus, longitudinally spaced pairs of registration holes 38 are provided through the sheet 16. One pair of holes 38 is provided for each one of the delay line patterns. As noted in more detail below, the holes 38 are located so that when the delay lines are formed, the portion in which the holes 38 are located will be severed from the delay line portion.

After the holes 38 have been placed through the sheet 16, the sheet is remounted on an appropriate jig and the holes 34 are plated by an electroless process. Thereafter, the holes 34 may be plated in a conventional electroplating bath so that the walls of the holes 34 form an electrical interconnection between the upper copper sheet 20 and the lower copper sheet 28 as shown in FIG. 2 wherein the plated portion of the wall is indicated by the reference numeral 40.

After the holes 34 have been plated, the upper and lower copper surfaces 20 and 28 are coated with a photo-resist material. The delay line patterns 42 are then printed on the surfaces 20 and 28. More specifically, a plurality of delay line patterns 42 are printed on the photo-resist material and each delay line pattern 42 comprises a first section 44 and a second section 46 which is spaced from the first section on the surface 20. That is, the sections 44 and 46 are spaced an equal distance on either side of the center line 36. The sections 44 and 46 are in the form of a spiral having an inner end which terminates at the respective holes 34 and an outer end which terminates in a tab 48. The lower surface 28 is printed with the patterns shown in FIG. 4 so that after etching, as noted in detail below, the delay line pattern will include an elongated member 49 of conducting material surrounded by a margin of dielectric material and a central electrically conducting lead 52 separated from the member 49 by the dielectric portion 54. The lead 52 extends from one hole 34 to the other hole 34 of the pair of holes. Additionally, conducting tabs 56 will be located below the elongated member 49 and spaced therefrom by the dielectric. The tabs 56 are in alignment with the conducting tabs 48 on the surface 20 of the sheet 16.

Thereafter, the sheet 16 is subjected to a gold plating operation. However, it is to be noted that the sheet 16 is covered with the photo-resist and that the gold plate will not adhere to the photo-resist. On the other hand, the holes 34 will be free of the photo-resist and, accordingly, the holes 34 will be gold plated thereby to protect the interconnection holes 34.

Figure 4:
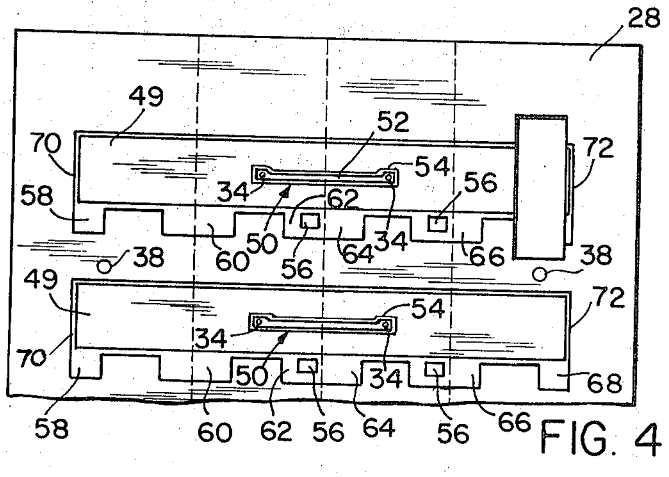
FIG. 4 is a bottom plan view thereof.

After the gold plating operation, the photo-resist is stripped from the sheet 16 and the sheet of delay line patterns is subjected to a conventional etching process to etch the copper surfaces 20 and 28 that have not been printed thereby to leave the delay line patterns of electrically conducting material shown in FIGS. 3 and 4 on the upper and lower surfaces of the dielectric layer 10, respectively. It is to be noted that spaces 58–68 (FIG. 4) are provided on the lower surface of the sheet 16 after etching the same. That is, the conducting sheet of material will have been removed from the areas designated by the reference characters 58–68 thereby leaving the dielectric layer 10 accessible through these spaces. The sheet 16 is then mounted on an appropriate jig utilizing the individual delay line pattern holes 38 to align the sheet 16 and the dielectric material in the spaces 58–68 is punched out so that clearance holes are left in the sheet 16 corresponding to the areas 58–68 formerly occupied by the dielectric material or layer 10. These holes are provided so that the tabs 48 of the delay line will be exposed when the sheet 16 is folded in the manner indicated hereinbelow.

Prior to punching out the dielectric layer in the areas defined by the spaces 58–68, the sheet 16 may be cut along the edges 70 and 72 of the elongated members 49 on the lower surface of the dielectric layer. Additionally, the upper surface of the exposed dielectric layer 10 is routed along the central line 36 and lines 74 and 76 spaced on either side of the central line 36 to provide fold lines for folding the sheet 16. As shown in FIG. 3, the section 44 of the delay line pattern 42 is bracketed by the fold line 74 and the routed center line 36 and the section 46 is bracketed by the routed center line 36 and the fold line 76.

Figure 5:
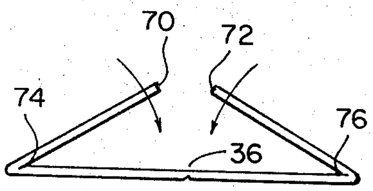
FIG. 5 is an end view of the sheet shown in FIGS. 3 and 4 illustrating a folding operation in diagrammatic form.

The outer end of the dielectric material or layer 10 is then folded upwardly along the fold line 76 so that the upper surface of the dielectric layer 10 is superposed on the pattern section 46 of the pattern 44. In a similar manner, the other outer longitudinally extending portion of the dielectric layer 10 is folded along the fold line 74 so that the layer 10 is superposed on the section 44 of the pattern 42, as shown in FIG. 5. An appropriate adhesive may be inserted between the end flaps shown in FIG. 5 and the delay line sections and set by appropriate heat and pressure so that the flaps remain superposed over the delay line sections.

Figure 6:
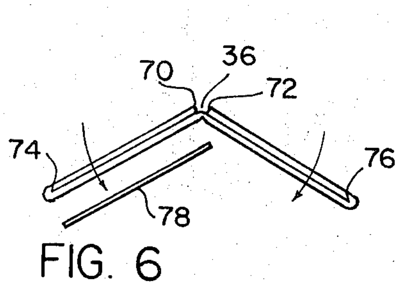
FIG. 6 is an end view of the delay line pattern sheet similar to FIG. 5, illustrating the further folding of the sheet.

The sheet 16 is then folded back along the routed center line 36 as shown in FIG. 6. A Mylar strip 78 may be inserted between the folded sections to insulate one section from the other. The sections are then affixed to each other by applying appropriate heat and pressure to cause the Mylar strip 78 to bond the sections together.

Figure 9:
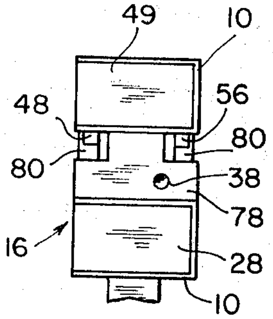
FIG. 9 is a top plan view of the delay line sheet in a folded condition.

It is to be noted that after the last folding step, the sections 44 and 46 of each delay line pattern 42 will be aligned with each other and will be surrounded by the dielectric layer 10. Additionally, the inner ends of the spiral delay line pattern sections will be connected together through the interconnecting holes 34 and the lead 52 while the depending tabs 48 and 56 will be exposed through the spaces 58–68 formerly occupied by the dielectric layer 10. To be more specific, the folded sheet 16 will appear as shown in FIG. 9 wherein each delay line pattern will have a strip 49 exposed on the outermost surface and surrounded by a margin of the dielectric layer 10. The exposed strip 49 functions as a ground plate. Each delay line pattern will be connected by an interconnecting section 78 which includes the registration holes 38. Additionally, the tabs 48 and 56 will depend from the body of each delay line section. The extension designated 80 in FIG. 9 between the tabs 48 and 56 and the section 78 comprise a portion of the dielectric layer 10.

The folded sheet of material shown in FIG. 9 is then run through a blanking die which cuts around the delay line patterns to produce individual delay line patterns with depending connecting tabs. That is, referring to FIG. 9, the blanking die cuts the section 78 and severs the same from adjacent delay line patterns. Additionally, the blanking die removes the section 80 so that the individual delay line patterns now comprise separate elements each having the depending tabs 48 and 56. It is to be noted that the rear surface of the tab 48, as taken in FIG. 9, comprises the tab 56 and the rear surface of the tab 56, as taken in FIG. 9, comprises the tab 48.

It will now be apparent that the method thus far disclosed illustrates an economical method of providing a plurality of delay line patterns simultaneously. That is, a plurality of delay line patterns are produced simultaneously and finally separated at the end of the process to provide a plurality of individual and separate elements. The simultaneous production of these elements substantially decreases the cost of fabricating the elements as opposed to individually fabricating each element.

Figure 7:
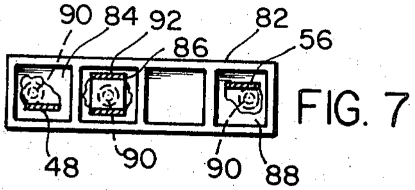
FIG. 7 is a top plan view, partially in section, illustrating the connection between a delay line pattern and the header.
Figure 8:
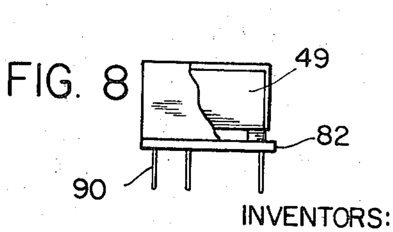
FIG. 8 is a side elevational view of the delay line of the present invention with parts broken away.

A header is provided as shown in FIG. 7 which includes a base 82 which may be fabricated from a plastic or the like having compartments 84, 86 and 88. Connecting pins 90 extend downwardly from the respective compartments 84–88. The connecting pin 90 in the compartment 86 is connected to a U-shaped member 92 which extends upwardly therefrom. The delay line elements are inserted into the header so that the tabs 48, 56 at each end of the delay line pattern engage the connecting pins 90 in the compartments 84 and 88, respectively. Additionally, the U-shaped member 92, which is fabricated from an electrically conducting material, is centered to engage the outermost conducting layers of the delay line element. Solder paste is then applied to the tabs and the pins to effect a soldered connection between the pins 90 in the compartments 84 and 88 and the tabs 48 and 56 and between the legs of the U-shaped member 92 and the outer conducting surfaces of the delay line element.

The delay line element and header combination are then transfer molded to encapsulate the delay line element to provide a delay line which may be connected to external circuitry through the connecting pins 90.

It is to be noted that the current in adjacent elements comprising a section of the spiral is in the same direction thereby increasing the inductance per unit length of the delay line as compared to a meandering type delay line.

Accordingly, a method for fabricating a delay line and a delay line per se has been disclosed which is economical to fabricate and reliable in operation.

While preferred embodiments of the method and apparatus have been disclosed herein, it will become obvious that numerous omissions, changes and additions may be made in such methods and apparatus without departing from the spirit and scope of the present invention.

What is claimed is:

1. The method of making a delay line utilizing a material having an upper and a lower electrically conducting surface separated by a dielectric layer comprising connecting together said upper and lower surfaces through said dielectric layer, placing a desired delay line pattern on said upper and lower surfaces, removing said upper and lower electrically conducting surfaces except for the portions thereof bearing said delay line pattern whereby only the upper and lower electrically conducting surfaces in the shape of said delay line pattern is left on said dielectric layer, folding the outer portions of said material inwardly so that each outer portion of said material is superposed over a portion of the delay line pattern formed on said upper surface, folding said material back to align the portions of the delay line pattern on each side of said first fold line with each other and providing connecting terminals for said delay line pattern to provide said delay line.

2. The method of Claim 1, in which a first fold line is provided on said material, said first fold line corresponding substantially with the center line of said material, comprising the further step of providing second and third fold lines on each side of said first fold line in spaced relationship thereto to facilitate folding of said outer portions of said material.

3. The method of Claim 2, including the step of locating said delay line pattern symmetrically on said upper surface with respect to said first fold line.

4. The method of Claim 3, including the step of providing an insulating material between the delay line pattern on said lower surface when said material is folded back along said first fold line.

5. The method of Claim 1, in which said upper and lower surfaces are connected together by providing a hole from said upper to said lower surface through said dielectric layer, and covering the walls defining said hole with an electrically conducting material.

6. The method of Claim 5, in which said delay line pattern is placed on said upper and lower electrically conducting surfaces by coating said surfaces with a photo-resist material, and printing the desired delay line pattern thereon, and said upper and lower surfaces are removed by stripping said photo-resist material from said surfaces, and etching said surfaces to remove the electrically conducting material from those portions of the surfaces not printed.

7. The method of Claim 1, in which the step of placing said delay line pattern on said upper and lower surfaces includes providing connecting tabs.

8. The method of Claim 7, in which a plurality of delay line patterns are simultaneously placed on said upper and lower surfaces, including the further step of separating each delay line pattern so that said connecting tabs extend outwardly.

9. The method of Claim 8, including the further step of initially providing registration holes in said material whereby said material may be mounted on studs projecting through said registration holes to align said material for the placement of said delay line pattern thereon.

10. The method of Claim 8, including providing clearance holes in said material adjacent said tabs prior to folding said material, whereby said tabs are exposed through said clearance holes when said material is folded.

11. The method of Claim 7, including providing a header with depending connecting pins, placing said delay line on said header, connecting said tabs to said pins, and encapsulating said delay line.

12. The method of making a delay line utilizing a material having an upper and a lower electrically conducting surface separated by a dielectric layer comprising placing a plurality of delay line patterns on said upper and lower electrically conducting surfaces wherein each pattern comprises at least two sections, connecting said upper and lower surfaces together through said dielectric layer at at least two points in each of said delay line patterns, removing portions of said upper and lower surfaces to leave only electrically conducting surfaces in the shape of said plurality of delay line patterns on said dielectric layer, folding said material to align said sections of each pattern, separating said plurality of individual delay line patterns, and providing connecting terminals for each delay line pattern to provide a plurality of delay lines.

13. The method of Claim 12, including the step of routing said material prior to said folding said material to provide a first central fold line and second and third fold lines spaced therefrom, folding the outer portions of said material inwardly along said second and third fold lines over said upper surface, folding said material rearwardly along said first fold line to align said sections of said patterns, and inserting an insulating member between the conducting surfaces adjacent said third fold line.

14. The method of Claim 12, wherein each delay line pattern includes depending tabs, said method comprising the further step of providing clearance holes in said material prior to folding said material so that said tabs are exposed when said material is folded, and separating said plurality of delay line patterns by cutting each pattern about its respective tabs so that each delay line is provided with at least a pair of depending tabs.

15. The method of Claim 14, including the further steps of providing a header having depending connecting pins, inserting said delay line into said header, connecting said tabs to respective ones of the connecting pins, and encapsulating said delay line and said header.

16. The method of Claim 12, in which said upper and lower surfaces are connected by providing a hole between said upper and lower surfaces through said dielectric layer, plating said holes by an electroless plating method, and plating said holes with an electroplating bath.

17. The method of Claim 16, in which said delay line patterns are placed on said upper and lower surfaces by coating said surfaces with a photo-resist material, and printing said delay line patterns, removing said upper and lower surfaces by removing said photo-resist material from said upper and lower surfaces, and etching said upper and lower electrically conducting surfaces to leave said plurality of delay line patterns on said dielectric layer.

18. The method of Claim 17, in which said material is gold plated prior to removing said photo-resist material whereby said gold adheres to the walls defining said holes.

* * * * *